July 12, 1966 S. L. BROADHEAD, JR 3,260,959

TUNABLE PHASE SHIFT RESONANT CIRCUIT STABILIZED CRYSTAL OSCILLATOR

Filed Dec. 30, 1963

INVENTOR.
SAMUEL L. BROADHEAD JR.
BY
Moody and Kintzinger
ATTORNEYS

United States Patent Office 3,260,959

Patented July 12, 1966

3,260,959

TUNABLE PHASE SHIFT RESONANT CIRCUIT STABILIZED CRYSTAL OSCILLATOR

Samuel L. Broadhead, Jr., Cedar Rapids, Iowa, assignor to Collins Radio Company, Cedar Rapids, Iowa, a corporation of Iowa Filed Dec. 30, 1963, Ser. No. 334,536
7 Claims. (Cl. 331—16)

Figures 1, 2:
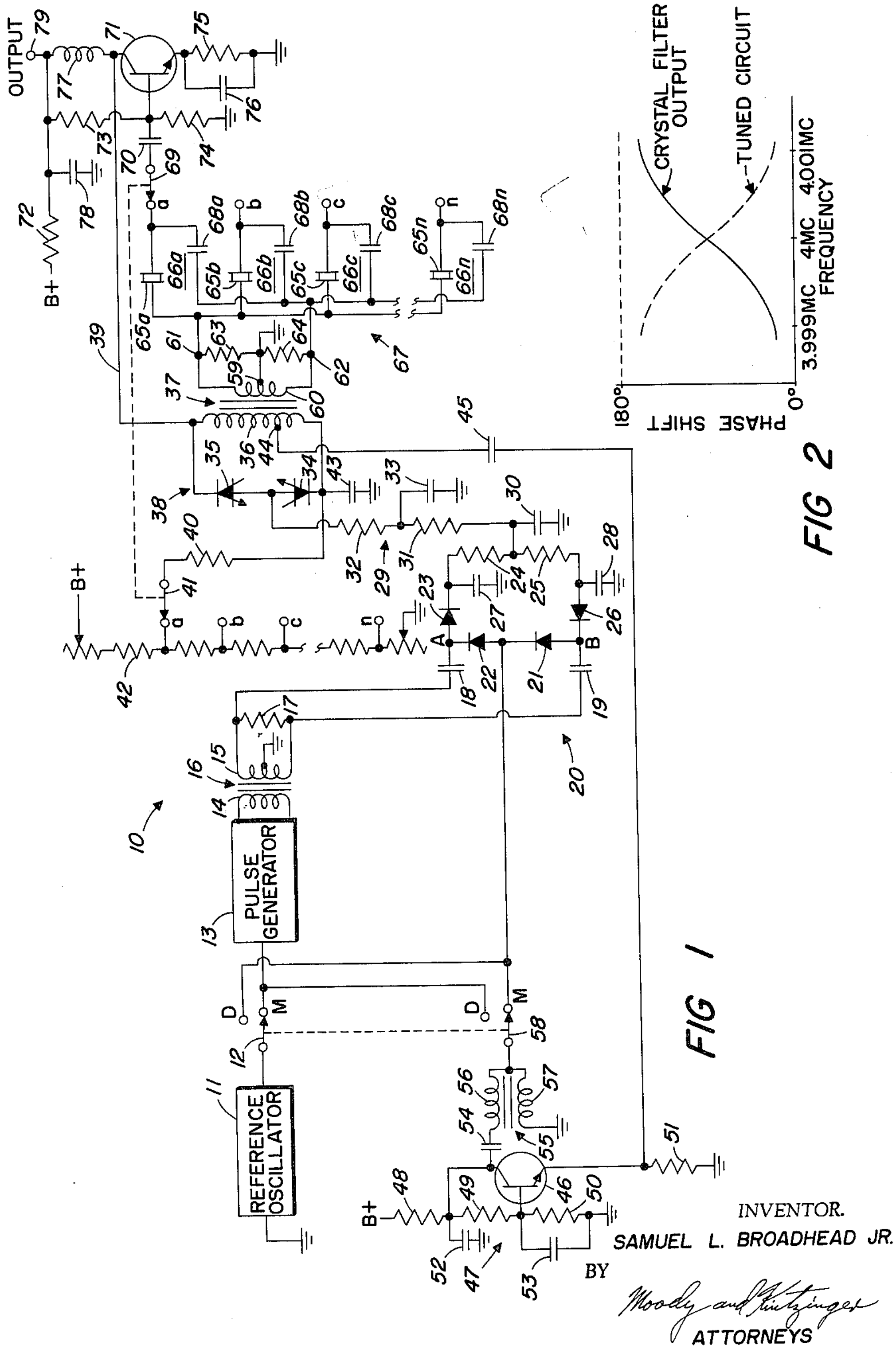

This invention relates in general to frequency multipliers and to frequency dividers, and in particular to a frequency multiplier and/or divider providing controlled individual locking of various crystal oscillator filters to various respective harmonics or subharmonics of a very precise and stable reference oscillator.

There are many frequency multipliers and also dividers, some utilizing L-C tuned circuits, and many using binary dividers (flip-flops). With the relatively large bandpass widths of L-C tuned circuits used in multipliers undesired frequencies at the output generally are not as greatly attenuated as desired. Further, when such L-C circuits are utilized in dividers as, for example, locked oscillators, difficulty is experienced in maintaining division by the desired respective factors. Many dividers using flip-flop circuitry exhibit, at the output, considerable undesired phase instability or jitter.

It is, therefore, a principal object of this invention to provide controlled individual locking of various crystal oscillator filters to various respective harmonics of the frequency of a stable reference oscillator in a frequency multiplier mode of operation.

A further object in a frequency divider mode of operation is to provide controlled individual locking of various crystal oscillator filters to various respective subharmonics of the frequency of a stable reference oscillator.

Still a further object is to provide both the frequency multiplier and the frequency divider modes of operation in a controlled circuit utilizing the same stable reference oscillator.

Anoter object is to insure frequency multiplication or division outputs precisely on frequency as selected from a circuit and to insure substantially complete freedom from undesired output frequencies.

Features of this invention useful in accomplishing the above objects include, in a multiple selective frequency output stabilized crystal oscillator circuit, a control voltage output from a discriminator applied to voltage variable capacitive control means in a tuneable circuit for phase locking of the frequency output from a switch selected crystal filter to the respective desired harmonic or subharmonic of the frequency of the reference oscillator. Pulses generated from the reference oscillator signal are, for the multiplier mode of operation, compared with the crystal oscillator frequency feedback signal in the phase discriminator, and when the selected output crystal filter section is selected for a subharmonic frequency, pulses are generated from the crystal oscillator frequency feedback signal for comparison with the reference frequency in the phase discriminator. This develops the control voltage applied to the voltage variable capacitive means in the tuneable circuit for phase locking of the selected output at the proper frequency relative to the fundamental reference frequency.

A specific embodiment representing what is presently regarded as the best mode for carrying out the invention is illustrated in the accompanying drawing.

In the drawing:

FIGURE 1 represents a multiple crystal filter frequency selected output stabilized crystal oscillator circuit having phase locking control to selected harmonics and subharmonics of the frequency of a reference oscillator in multiplier and divider modes of operation; and FIGURE 2 includes the phase shift curves vs. frequency variation about a 4 mc. middle frequency of a crystal filter output and the tuned circuit.

Referring to the drawing:

The stabilized crystal oscillator 10 of FIGURE 1 receives a reference frequency input from reference oscillator 11 which is fed to switch 12 and through switch 12 in the frequency multiplier mode of operation as an input to pulse generator 13. The pulse output at the reference frequency from pulse generator 13 is coupled from primary coil 14 to the center tapped and grounded secondary coil 15 of coupling transformer 16. The output terminals of secondary coil 15 are interconnected by resistor 17 and are also connected through capacitors 18 and 19 to points A and B of phase discriminator 20.

Phase discriminator 20 includes two diodes 21 and 22 connected serially cathode to anode between point B and point A with the cathodes toward point A. Points A and B are also interconnected from point A serially through diode 23, resistors 24 and 25, and diode 26 with diode anodes toward point A and cathodes toward point B. Capacitors 27 and 28 are provided between the common junction of diode 23 and resistor 24 and the common junction of resistor 25 and diode 26, respectively and ground. The output junction of the phase discrimintor 20 between resistors 24 and 25 is connected to loop filter 29 including, first, a connection through capacitor 30 to ground, then serially connected resistors 31 and 32, and from the junction of resistor 31 and 32 a connection through capacitor 33 to ground. The other end terminal of loop filter 29 out of resistor 32 is connected to the common junction of voltage variable capacitors (Varicaps) 34 and 35.

The common junction between the Varicaps 34 and 35 is between anodes thereof and the cathodes of the Varicaps are connected to opposite ends of the primary coil 36, of signal transformer 37, forming with the primary coil 36, a tuned circuit 38. A frequency output signal return line 39 is connected to the junction between Varicap 35 and primary coil 36 of the tuned circuit 38. The common junction between Varicap 34 and primary coil 36 of tuned circuit 38 is connected through resistor 40 to a voltage selective positional switch 41, associated with a multiterminal (*a* through *n*) voltage divided 42 connected between B+ and ground. The common junction between Varicap 34 and primary coil 36 is also connected through capacitor 43 to ground.

The Varicaps 34 and 35 are a utilization of the voltage sensitive junction capacitive characteristics of semiconductor diodes as variable capacitance in the tuned circuit 38 of the stabilized crystal oscillator. These semiconductor devices are of the type comprising a P-N junction, which, when forwardly biased (positive to the P-type material and negative to the N-type material) permit passage of current. When reverse biased (negative to the P-type material and positive to the N-type material) each blocks the flow of current with the junction of each exhibiting capacitance as an inverse function of the reverse bias. These devices are known, and may be, for example, those described in an article entitled "Semiconductor Variable Capacitors" by H. R. Smith in the December 1958 issue of Radio and T.V. News magazine, wherein such devices are defined as commercially available Varicaps and Semicaps. Because of the diode characteristics of these voltage variable capacitors (Varicaps) they may be described as being polarized in the sense that a diode is polarized, and may be referred to as including a cathode and an anode just as with a diode. The Varicaps 34 and 35 are each illustrated as a composite representation of two parallel lines for capacitance, a diode symbol between the parallel lines to represent the polarization characteristics, and an arrow to indicate variability.

A frequency signal feedback line from tuned circuit 38 is connected from tap 44 of primary coil 36 through capacitor 45 for applying the frequency developed in the tuned circuit 38 back to the emitter of transistor 46 in buffer amplifier 47. A voltage divider circuit of buffer amplifier 47 includes resistors 48, 49 and 50, serially connected between positive B+ voltage supply and ground for applying proper voltage biases between the electrodes of transistor 46 along with resistor 51 connected between the emitter of the transistor and ground. The common junction of resistors 48 and 49 is connected to the collector of transistor 46 and also through capacitor 52 to ground, and the common junction of resistors 49 and 50 is connected to the base of transistor 46 and through capacitor 53 to ground. The signal output from the collector of transistor 46 is passed through capacitor 54 to a signal coupling transformer 55 with the input signal connected to an end of input coil 56, the other end of which has a common junction with the other transformer coil 57 and through the coil 57 to ground.

The common junction between coils 56 and 57 of coil transformer 55 is connected to switch 58 and through switch 58 in the frequency multiplier mode of operation as a sinusoidal signal input path to the phase discriminator 20 at the common junction of diodes 21 and 22. Both switches 12 and 58 are movable from a multiplier position indicated by "M," respectively, to a divider contact position indicated by "D," respectively, and they are mechanically connected, as indicated by the dotted line extending between the arms of the switches 12 and 58, for common movement between the multiplier and divider switched modes of operation. When switched to the divider mode of operation, the output from reference oscillator 11 is applied directly to the phase discriminator 20 at the common junction of diodes 21 and 22 as a sinusoidal waveform input thereto, and the signal output from the buffer amplifier 47 is applied as a signal input to pulse generator 13 to develop the pulse input applied to phase discriminator 20 at points A and B thereof. It should be noted that in the multiplier mode of operation, phase discriminator 20 is referenced back to ground through coil 57 of buffer amplifier 47 and when in the divider mode of operation is referenced back to ground through reference oscillator 11.

Referring again to signal transformer 37 of tuned circuit 38, the transformer 37 is equipped with a center tap 59, grounded secondary coil 60, opposite end terminals 61 and 62 of which are connected through resistors 63 and 64 to ground, respectively. The output terminal 61 of secondary coil 60 is connected in parallel to crystals **65*a* through 65*n* of crystal filter sections 66*a* through 66*n* of crystal filter section bank 67. The outer output terminal 62 of secondary coil 60 is connected in parallel to capacitors 68*a* through 68*n*. The other sides of crystals 65*a* through 65*n*, and capacitors 68*a* through 68*n***, are connected together by pairs, respectively, and to output terminals *a* through *n*, respectively. These multiple output terminals, *a* through *n*, of crystal filter bank 67, may be selectably connected by switch 69 as a selective frequency input source through capacitor 70 to the base of output signal amplifier transistor 71.

Both switches, 41 of voltage divider 42, and switch 69 of crystal filter bank 67, may be switched through a range of terminal connections, *a* through *n*, and are mechanically connected as indicated by the dotted line extending between the arms of switches 41 and 69, for common movement and simultaneous switching to the corresponding terminals *a* through *n*, respectively. Such switching, obviously, is for selecting the desired frequency output and simultaneously switching the reference bias voltage applied to the tuned circuit 38, consistent with the frequency output from the switch selected crystal filter section output terminal of the multiple crystal filter sections **66*a* through 66*n*. It should be noted, however, that with some embodiments switching voltage bias such as with switch 41 would not be required as the voltage variation control out of phase discriminator 20** would be adequate for phase lock with each selectable output frequency.

A voltage divider including resistors 72, 73, and 74 is provided between B+ and ground for applying proper voltage bias between electrodes of transistor 71, along with resistor 75 connected in parallel with capacitor 76 between the transistor emitter and ground. The common junction of resistors 72 and 73 is connected through coil 77 to the collector of transistor 71 and also through capacitor 78 to ground. The common junction of resistors 73 and 74 is connected to the base of transistor 71.

The frequency output signal return line 39, connected to the junction between Varicap 35 and the primary coil 36 of the tuned circuit 38, is connected to the collector of transistor 71. An output terminal 79 for the stabilized crystal oscillator is provided at the common junction of resistors 72, 73, coil 77 and capacitor 78 for connection to utilizing equipment, as desired.

During operation of the stabilized crystal oscillator 10, the particular switch selected crystal filter section, of crystal filter sections **66*a* through 66*n*, is phase locked to a harmonic, if the selected filter section is of a higher frequency, or a subharmonic, if the selected oscillator is of a lower frequency, of a more precise and stable reference oscillator 11. Generally, conventional crystal oscillators cannot be "pulled" sufficiently in frequency to permit such action except under very limited and usually impractical conditions. The filter sections 66*a* through 66*n* have pass bands extending approximately between the series resonance and parallel resonance of the respective crystal 65*a* through 65*n***. This is in the order of from 0.05 to 0.1 percent of the respective crystal frequencies, and is much greater than the instability factor of the respective crystals which may be, as an example, 0.005 percent.

As frequency of a filter section varies through its pass band approximately between series and parallel resonance of the crystal (approximately 0.05 to 0.1 percent of the crystal frequency), the phase shift at the output is through nearly 180° as indicated by the solid curve in FIGURE 2. This is shown for a crystal filter having a middle frequency at approximately 4 mc., as a typical example, and a pass band of approximately plus or minus 1 kc. The output of such a filter, when connected to amplifier transistor 71, forms an oscillator with the amplifier transistor 71 and tuned circuit 38, which has been switched by switch 41 for proper bias from voltage divider 42 for frequency resonance about the approximate 4 mc. desired frequency output selected. Circuit means provides nearly a 180° phase shift range in the variable tuned circuit 38, as indicated by the dashed line curve in FIGURE 2. Further, the phase shift between the selected crystal filter section output and the variable tuned circuit totals substantially 180° throughout the pass band range of frequency adjustment.

Phase shift of the tuned circuit 38 and amplifier transistor 71 oscillator circuit is varied with tuning of the tuned resonant circuit 38 by varying the voltage applied to the voltage variable capacitors (Varicaps) 35 and 34. Variation of voltage input to the common connection between the Varicaps can provide a phase shift approaching 180° in the tuned circuit 38, thereby changing the oscillator frequency by approximately 0.05 to 0.1 percent. The desired controlling phase locking voltage input to the common connection of the Varicaps is developed as an output from phase discriminator 20, passed through loop filter 29 to the tuned circuit 38. Actually, the loop filter must pass the difference (error) discriminator output frequency signal with low phase shift (less than about 30°, for example) and must also attenuate input frequency signals applied to the discriminator 20.

One of the inputs to discriminator 20 is a more or less generally sinusoidal waveform applied at the common junction of diodes 21 and 22, and the other input is a lower frequency input of recurrent pulses applied at points A and B. The discriminator compares the sinusoidal waveform with a harmonic of the pulse frequency to provide an output in a conventionally known discriminator action. A frequency feedback signal is fed from tap 44 back to buffer amplifier 47 from which a sinusoidal output is switched for application, in the multiplier mode, to the common junction of diodes 21 and 22 in phase discriminator 20. When the switch connected filter section output chosen is for a harmonic frequency of the frequency of reference oscillator 11, the reference oscillator output frequency is applied to pulse generator 13 to develop pulses applied as a pulse input to points A and B of phase discriminator 20 in the frequency multiplier mode of operation. When switch 69 and bias voltage switch 41 are simultaneously switched for a subharmonic output frequency switches 12 and 58 are thrown to the divider position for application of the higher frequency output of the reference oscillator directly to the common junction of diodes 21 and 22, and for application of the output signal of the buffer amplifier to pulse generator 13 for the application of lower frequency pulses to points A and B of phase discriminator 20. Obviously, stabilized crystal oscillators, according to the invention, could be provided with only the multiplier mode of operation, or only the divider mode of operation, or, as shown, for operation as selected between both modes of operation. Switches 12 and 58 are switched from one mode of operation to the other when switches 69 and 41 are switched from multiplier output frequencies to the divider output frequency mode of operation and vice versa. Switching of the bias voltage level applied from voltage divider 42 to the tuned circuit 38 changes the bias applied across Varicaps 34 and 35 for the resonant frequency range consistent with the selected filter section output frequency range. However, as pointed out before, some embodiments would not require switching of the voltage bias applied to the tuned circuit and across the Varicaps. Phase locking with the tuned circuit 38 is with a phase locking voltage around ground since the phase discriminator 20 is referenced back to ground through the signal source feeding an input to the junction of diodes 21 and 22 of phase discriminator 20 (although another voltage reference could be utilized as desired).

Thus, a control voltage output is provided from a phase discriminator and applied to voltage variable capacitive control means in a tuneable circuit for phase locking of the frequency output from a switch selected crystal filter to the respective desired harmonic or subharmonic output of a reference oscillator. Pulses generated from the reference oscillator signal are, for the multiplier mode of operation, compared with the crystal oscillator frequency feedback in the phase discriminator, and when the selected output crystal filter section is selected for a subharmonic frequency, pulses are generated from the crystal oscillator frequency feedback signal for comparison with the reference frequency in the phase discriminator. This develops the control voltage applied to the voltage variable capacitive means in the tuneable circuit for phase locking of the selected output at the proper frequency relative to the fundamental reference frequency.

Whereas this invention is here illustrated and described with respect to a specific embodiment thereof, it should be realized that various changes may be made without departing from the essential contribution to the art made by the teachings hereof.

I claim:

1. In a multiple selective output frequency stabilized crystal oscillator circuit: a reference frequency oscillator; a bank of crystal filters each designed for a particular individual frequency bandpass; means for connecting output circuit means to the desired crystal filter; a tuneable phase shift resonant circuit; voltage bias means connected to said tuneable phase shift resonant circuit for biasing the tuneable phase shift resonant circuit to a resonant frequency range consistent with the frequency bandpass range of the selected crystal filter; means forming an oscillator including the selected crystal filter and the tuneable phase shift resonant circuit; signal feedback means from said tuneable phase shift resonant circuit to a buffer amplifier; a phase discriminator; signal path means connecting the output signal of said reference oscillator to said phase discriminator, and signal path means connecting the output signal of said buffer amplifier to said phase discriminator; pulse generating means included in one of said signal path means connecting signals to said phase discriminator; voltage variable capacitive means in said tuneable phase shift resonant circuit capable of varying the frequency of said tuneable phase shift resonant circuit by bias voltage variation applied to said voltage variable capacitive means; means coupling the output of said phase discriminator as a variable voltage bias frequency varying input to said tuneable phase shift resonant circuit; wherein said voltage variable capacitive means in the tunable phase shift resonant circuit includes two solid state voltage variable capacitors, each having an anode electrode and a cathode electrode, and with a common junction between like electrodes of the voltage variable capacitors being the input junction receiving a variable voltage bias frequency varying input developed as an output by said phase discriminator; and wherein said common junction between the voltage variable capacitors is between anodes of said voltage variable capacitors, and the cathodes of said voltage variable capacitors are connected through a primary coil of a signal coupling transformer having a secondary coil with end terminals connected to the bank of said crystal filters for providing input signals to the crystal filters.

2. In a multiple selective output frequency stabilized crystal oscillator circuit: a reference frequency oscillator; a bank of crystal filters each designed for a particular individual frequency bandpass; means for connecting output circuit means to the desired crystal filter; a tuneable phase shift resonant circuit; voltage bias means connected to said tuneable phase shift resonant circuit for biasing the tuneable phase shift resonant circuit to a resonant frequency range consistent with the frequency bandpass range of the selected crystal filter; means forming an oscillator including the selected crystal filter and the tuneable phase shift resonant circuit; signal feedback means from said tuneable phase shift reasonant circuit to a buffer amplifier; a phase discriminator; signal path means connecting the output signal of said reference oscillator to said phase discriminator, and signal path means connecting the output signal of said buffer amplifier to said phase discriminator; phase generating means included in one of said signal path means connecting signals to said phase discriminator; voltage variable capacitive means in said tuneable phase shift resonant circuit capable of varying the frequency of said tuneable phase shift resonant circuit by bias voltage variation applied to said voltage variable capacitive means; means coupling the output of said phase discriminator as a variable voltage bias frequency varying input to said tuneable phase shift resonant circuit; and including switch means for switching said pulse generating means between the signal path means connecting the output signal of said reference oscillator to said phase discriminator, for the multiplier mode of operation, to the signal path means connecting the output signal of said buffer amplifier to said phase discriminator for the divider mode of operation.

3. The multiple selective output frequency stabilized crystal oscillator circuit of claim 2, wherein said switch means also connects the buffer amplifier output directly to said phase discriminator for the multiplier mode of operation; and including means for directly connecting the output of said reference oscillator to the phase discriminator in the divider mode of operation.

4. The multiple selective output frequency stabilized crystal oscillator circuit of claim 1, wherein the means forming the oscillator includes an amplifier with said amplifier between the desired crystal filter and an output terminal, and feedback circuit means interconnecting an output electrode of said amplifier and the tuneable phase shift resonant circuit.

5. The multiple selective output frequency stabilized crystal oscillator circuit of claim 1, wherein said voltage bias means connected to said tuneable phase shift resonant circuit for biasing the tuneable phase shift resonant circuit to a resonant frequency range consistent with the frequency bandpass range of the selected crystal filter is connected to a junction between the cathode of one of the voltage variable capacitors and the primary coil of the signal coupling transformer; and with means connecting the common junction between the cathode of the other voltage variable capacitor and the other end of the primary coil to the output circuit means comprising an output signal path from the desired crystal filter.

6. The multiple selective output frequency stabilized crystal oscillator circuit of claim 1, wherein the means coupling the output of said phase discriminator to said tuneable phase shift resonant circuit includes filter means for passing the difference frequency of a harmonic related frequency of the pulse generator within the pass band of the output selected crystal filter section and the other input to the phase discriminator while attenuating the input frequencies to the phase discriminator.

7. In a multiple selective output frequency stabilized crystal oscillator circuit, a reference frequency oscillator; a bank of crystal filters each designed for a particular individual frequency bandpass; first switch means for connecting output circuit means to the desired crystal filter; a tuneable phase shift resonant circuit; voltage bias means connected to said tuneable phase shift resonant circuit; means forming an oscillator including the particular selected switch connected crystal filter, output means, the tuneable phase shift resonant circuit, and a connection from said output means to said tuneable phase shift resonant circuit; signal feedback means from said tuneable phase shift resonant circuit to a buffer amplifier; a phase discriminator; pulse generating means providing an output coupled through signal coupling means to two input terminals of said phase discriminator; said phase discriminator including two diodes serially connected cathode to anode between said two input terminals, and a third phase discriminator input terminal at the common junction between said diodes; switch means for simultaneously connecting the output of said reference oscillator as an input to said pulse generating means and the output of said buffer amplifier as an input directly to the third input terminal of said phase discriminator in a multiplier mode of operation; said switch means also being selectively switchable for simultaneously connecting the output of said buffer amplifier as an input to said pulse generator and the output of said reference oscillator directly to said third input terminal of the phase discriminator in a divider mode of operation; and filter means interconnecting the output of said phase discriminator and an input terminal of said tuneable phase shift resonant circuit for coupling the output of said phase discriminator as a variable voltage bias frequency varying input to said tuneable phase shift resonant circuit.

References Cited by the Examiner

UNITED STATES PATENTS

| | | | |
|---|---|---|---|
| 2,575,363 | 11/1951 | Simons | 331—161 |
| 3,020,493 | 2/1962 | Carroll | 332—30 |
| 3,021,492 | 2/1962 | Kaufman | 331—36 |

FOREIGN PATENTS

| | | |
|---|---|---|
| 622,883 | 6/1961 | Canada. |
| 839,422 | 6/1960 | Great Britain. |

ROY LAKE, *Primary Examiner.*

J. KOMINSKI, *Assistant Examiner.*